US009466599B2

(12) United States Patent
Nair

(10) Patent No.: US 9,466,599 B2
(45) Date of Patent: Oct. 11, 2016

(54) STATIC CURRENT IN IO FOR ULTRA-LOW POWER APPLICATIONS

(71) Applicant: NXP B.V., Eindhoven (NL)

(72) Inventor: Mukesh Nair, Bangalore (IN)

(73) Assignee: NXP B.V., Eindhoven (NL)

( * ) Notice: Subject to any disclaimer, the term of this patent is extended or adjusted under 35 U.S.C. 154(b) by 203 days.

(21) Appl. No.: 14/030,770

(22) Filed: Sep. 18, 2013

(65) Prior Publication Data

US 2015/0077887 A1    Mar. 19, 2015

(51) Int. Cl.
*H02H 9/00* (2006.01)
*H01L 27/02* (2006.01)

(52) U.S. Cl.
CPC ................... *H01L 27/0266* (2013.01)

(58) Field of Classification Search
CPC ....................................................... H02H 9/04
USPC ............................................................ 361/56
See application file for complete search history.

(56) References Cited

U.S. PATENT DOCUMENTS

| 6,724,603 B2 * | 4/2004 | Miller et al. ................. 361/111 |
| 2002/0080536 A1 * | 6/2002 | Clark et al. ..................... 361/56 |
| 2006/0250732 A1 * | 11/2006 | Peachey ........................... 361/56 |
| 2007/0121262 A1 | 5/2007 | Loh et al. |
| 2013/0105951 A1 | 5/2013 | Popovich et al. |

OTHER PUBLICATIONS

Maloney, Timothy J. et al; "Methods for designing low-leakage ESD power supply clamps"; Journal of Electrostatics 62; Science Direct; pp. 95-97 (2004).
Extended European Search Report for application 14184743.4 (Jan. 21, 2015).
Koo, Yong-Seo, et al; "Design of Gate-Ground-NMOS-Based ESD Protection Circuits with Low Trigger Voltage, Low Leakage Current, and Fast Turn-On"; ETRI Journal, vol. 31, No. 6; 7 pages (Dec. 2009).

* cited by examiner

*Primary Examiner* — Thienvu Tran
*Assistant Examiner* — Tien Mai

(57) ABSTRACT

An input/output (IO) circuit including: an IO driver circuit; an electrostatic discharge (ESD) protection semiconductor switch with a first input configured to receive an ESD, a second input connected to an ESD rail, and a switch control input; an ESD trigger circuit connected to the switch control input, wherein the ESD trigger circuit is configured to produce a trigger signal to close the protection semiconductor switch when the ESD detection circuit detects an ESD; and a bias circuit configured to provide a back bias signal to an isolated well of the ESD protection semiconductor switch when IO circuit is in normal operation.

22 Claims, 4 Drawing Sheets

STATIC CURRENT IN IO FOR ULTRA-LOW POWER APPLICATIONS

TECHNICAL FIELD

Various exemplary embodiments disclosed herein relate generally to IO for ultra-low power applications.

BACKGROUND

As devices are scaled down static leakage increases and is becoming significant in ultra-low power applications. ESD devices are not active when the circuit is operating and are a source of current leakage. To put a switch in place to switch out the ESD devices may almost double the size and cost of the overall circuit.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to an input/output (IO) circuit including: an IO driver circuit; an electrostatic discharge (ESD) protection semiconductor switch with a first input configured to receive an ESD, a second input connected to an ESD rail, and a switch control input; an ESD trigger circuit connected to the switch control input, wherein the ESD trigger circuit is configured to produce a trigger signal to close the protection semiconductor switch when the ESD detection circuit detects an ESD; and a bias circuit configured to provide a back bias signal to an isolated well of the ESD protection semiconductor switch when IO circuit is in normal operation.

Further, various exemplary embodiments relate to a method of back biasing an electrostatic discharge protection semiconductor switch having an isolated well in an IO circuit including: applying a back bias signal to the isolated well of the ESD protection semiconductor switch during normal integrated circuit operation; detecting an ESD; generating an ESD trigger signal; applying the ESD trigger signal to the ESD protection switch to open the ESD protection switch to connect the ESD to an ESD rail; and grounding the isolated well when the ESD is detected.

Further, various exemplary embodiments relate to an input/output (IO) circuit including: an IO driver circuit; an electrostatic discharge (ESD) protection semiconductor switch having an integrated p-well (IPW) node, wherein the ESD protection semiconductor switch is connected between a voltage source and a ground configured to connect the ESD to the ground, wherein in the ESD protection semiconductor switch is an NMOS device; an ESD trigger circuit connected to a gate of the ESD protection semiconductor switch, wherein the ESD trigger circuit is configured to produce a trigger signal to close the ESD protection semiconductor switch when the ESD detection circuit detects an ESD; a bias voltage source configured to produce a negative back bias signal; a bias voltage semiconductor switch connected between the bias voltage source and the ESD protection semiconductor switch, wherein the bias voltage semiconductor switch is configured to control the application of the back bias signal to the IPW node; and an IPW node grounding semiconductor switch connected between the IPW node and the ground, wherein the IPW node grounding semiconductor switch is configured to connect the IPW node to ground based upon the trigger signal indicating the ESD.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
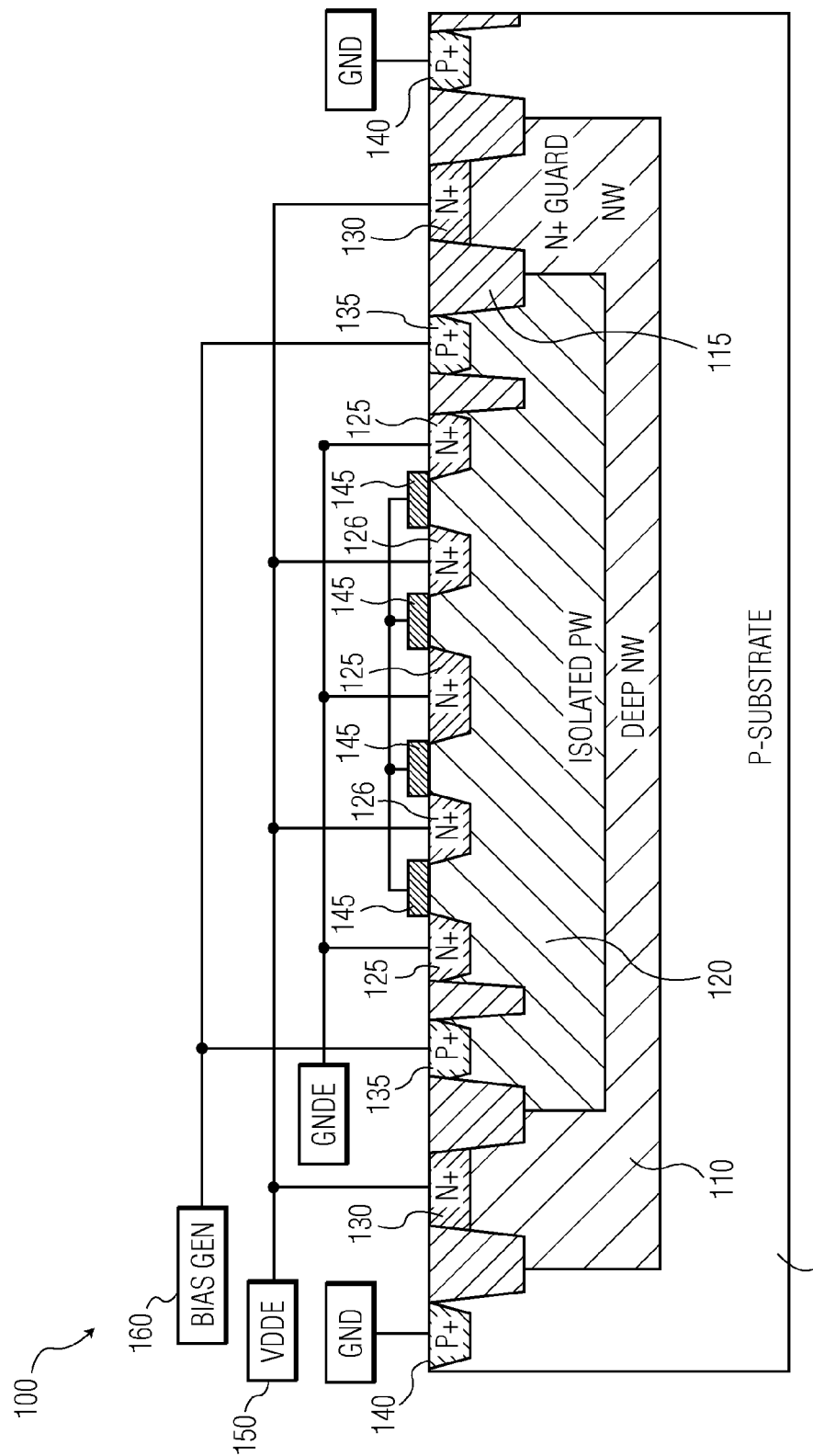
FIG. 1 illustrates a cross-sectional view of an embodiment in accordance with the invention of a BigFET 100 that may be used in an ESD circuit.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Current integrated circuits (ICs) may include many input/output (IO) pins. Some ICs may include a hundred or more pins. An IO circuit may be associated with each IO pin to control and drive the IO of the pin. As these IO pins are exposed to the environment, especially while being transported and handled during manufacturing, they are subject to electrostatic discharge (ESD). ESD may result in very short high voltage signal being present at the IO pin. As a result ESD protection circuits may be implemented at each IO pin to protect the IO and other internal IC circuitry from being damaged by ESD.

Such ESD protection circuitry typically includes an ESD detector and trigger and an ESD protection semiconductor switch. The ESD detector and trigger detects the presence of ESD and generates a trigger signal that opens the ESD protection semiconductor switch. Because of the high charge (current) involved in ESD the ESD protection semiconductor switch may be a large field effect transistor (BigFET). Such a BigFET may have a static leakage current of up to 3 µA. In an IC that may have, for example, 100 IO pins and hence potentially 100 ESD switches protecting these pins, the total leakage current may be 0.3 mA. In today's low power and ultra-low power ICs, a 0.3 mA leakage current is a significant power draw that degrades the performance of the IC. Accordingly, there remains a need to reduce the static current draw of ESD protection circuits. In addition, the IO driver circuit may also include one or more large semiconductor transistors that may also be idle at times resulting additional large static currents.

The ESD protection circuits may be implemented as a centralized ESD system or as a distributed ESD system. In the centralized ESD system a few ESD protection circuits are used in the IC to protect the IO of the IC from ESD. In a distributed ESD system, each IO pin and its associated IO drivers may have an ESD protection circuit. Both types will be discussed below.

In the embodiments described below, the static current of the ESD protection semiconductor switches, which are Big-FETs, are reduced by applying a back bias. In the example described above for a BigFET with a 3 µA static leakage current, the application of a 1V back bias may reduce the static current leakage to 150 nA. This is a 20× reduction in static leakage current. In the example of an IC with 100 ESD protection circuits, the total static leakage current due to the BigFETs found in the ESD protection circuits may be reduced from 300 µA to 15 µA.

FIG. 1 illustrates a cross-sectional view of an embodiment in accordance with the invention of a BigFET 100 that may be used in an ESD circuit. Also, such a BigFET 100 may also be found in the IO driver circuits. The illustrated BigFET 100 is an NMOS device. The BigFET 100 includes a P-substrate 105, a deep N-well (NW) region 110 that includes a N$^+$ guard region 115, and an isolated P-well (IPW) 120. The BigFET further includes N$^+$ doped regions 125 inside the IPW 120 and N$^+$ doped regions 130 over the deep NW region 110. The alternating N$^+$ doped regions 125, 126 form the source and the drain the BigFET 100. Further, the BigFET includes P$^+$ doped regions 135 inside the IPW 120 and P$^+$ doped regions 140 over the P-substrate 105. The BigFET also includes gate electrodes 145 formed on gate regions of the IPW 120 between the N$^+$ doped regions 125. A voltage applied to the gate electrodes 145 may cause the BigFET 100 to turn on and to allow current to flow between the source and the drain. A voltage VDDE 150 may be applied to the drain of the BigFET 100, and the source of the BigFET 100 may be connected to a ground GNDE 155. A bias generator 160 applies a bias voltage to the P$^+$ doped regions 135 in order to apply a back bias on the IPW 120. As described above, such a voltage may greatly decrease the static current leakage of the BigFET.

Most ESD protection circuits use NMOS BigFETs, so a negative back bias voltage is needed. The use of a negative back bias voltage with respect to the source complicates the IO circuit structure as the other circuit elements of the IO circuit may need to be isolated from the negative back bias voltage. If instead a PMOS BigFET is used in the ESD protection circuit, then a positive back bias voltage may be used.

Figure 2:
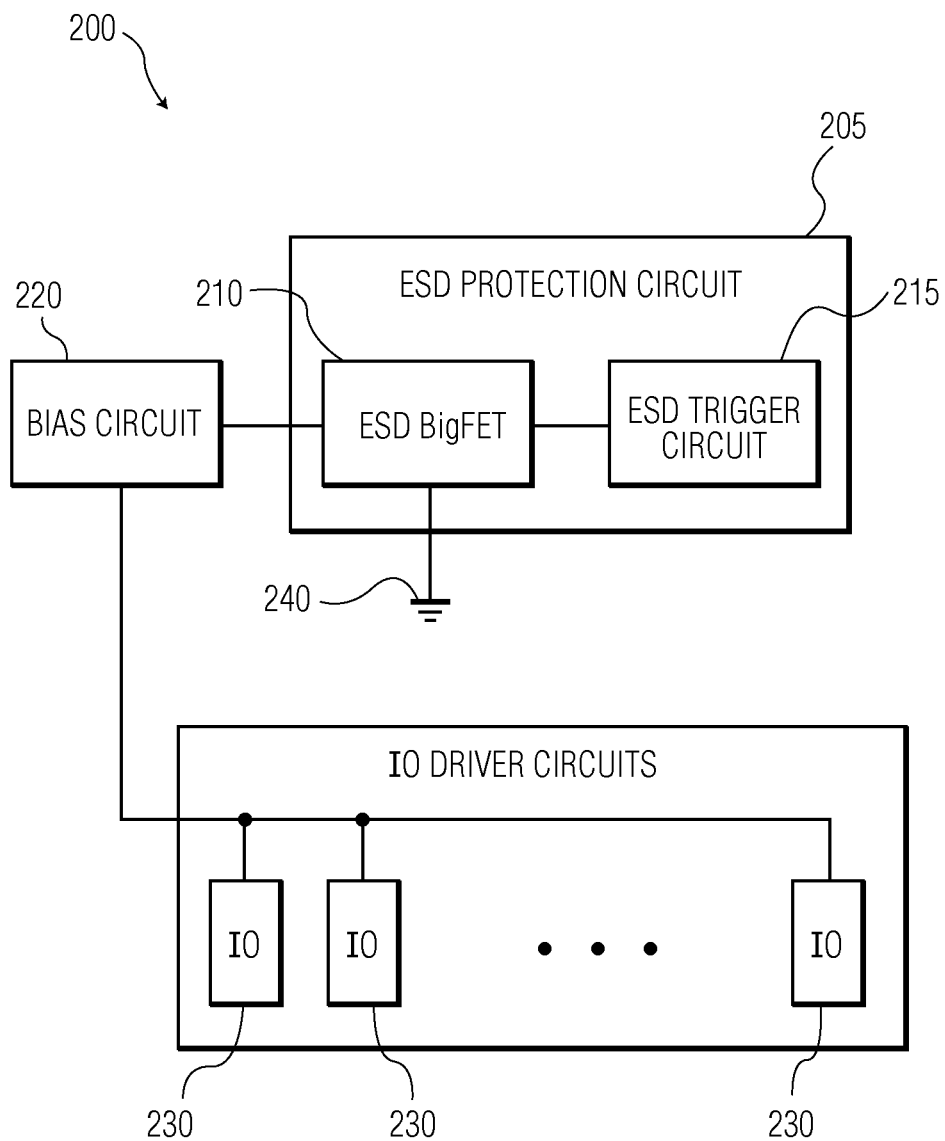
FIG. 2 illustrates an embodiment in accordance with the invention of an integrated circuit with centralized ESD protection for the IO circuits.

FIG. 2 illustrates an embodiment in accordance with the invention of an integrated circuit with centralized ESD protection for the IO circuits. The integrated circuit 200 includes an ESD protection circuit 205, a bias circuit 220 (which could also be reused from other portions within the IC), and IO driver circuits 230. In the IC 200 the ESD protection circuit 205 is centrally located. Also, there may be more than one centrally located ESD protection circuit 205 depending upon the size and geometry of the IC 200. The ESD protection circuit 205 includes an ESD BigFET 210 and ESD trigger circuit 215. The ESD BigFET 210 may be an NMOS device as described in FIG. 1 or a PMOS device depending in various design parameters. In either case the BigFET is designed to be able to handle a specified level of ESD. The ESD trigger circuit 215 detects ESD in the IC, especially ESD present at the IO of the IC 200. When the trigger circuit 215 detects ESD, the trigger circuit 215 produces a trigger signal to switch and open the ESD BigFET 210 in order to conduct the ESD to ground 240. Further the ESD may be conducted to a common rail. The ground 240 or the common rail may be called an ESD rail in order to refer to both embodiments.

The bias circuit 220 may provide a bias signal to the ESD BigFET 210 when the IC is in normal operation. Normal operation for purposes of this description is any operation of the IC other than ESD operation. The bias signal back biases the ESD BigFET 210 in order to reduce the static leakage current of the ESD BigFET 210. As discussed above, the bias signal may have a negative or positive voltage relative to ground depending on whether the BigFET 210 is an NMOS (negative bias) or PMOS (positive bias) device. The bias circuit 220 an ESD protection circuit 205 may include specific isolating and control elements in order to control the application of the bias signal during normal operation of the IC 200 as well as during ESD. An example of a more detailed embodiment in accordance with the invention for these circuits will be described below in FIG. 4.

The IO driver circuits 230 may also include a large semiconductor conductor transistor. Such large semiconductor transistors may also be back biased when not active in order to reduce their static leakage current. Accordingly the bias circuit 220 may also provide a bias signal to the IO driver circuits 230. The IO driver circuit 230 also has an enable pin that receives a control signal to enable and disable the IO driver circuit 230 and hence the IO pin. The control signal applied to the enable pin of the IO driver circuit 230 may also be used to apply the bias signal to the large semiconductor transistor in the IO driver circuit 230 when the IO driver circuit 230 is idle.

Figure 3:
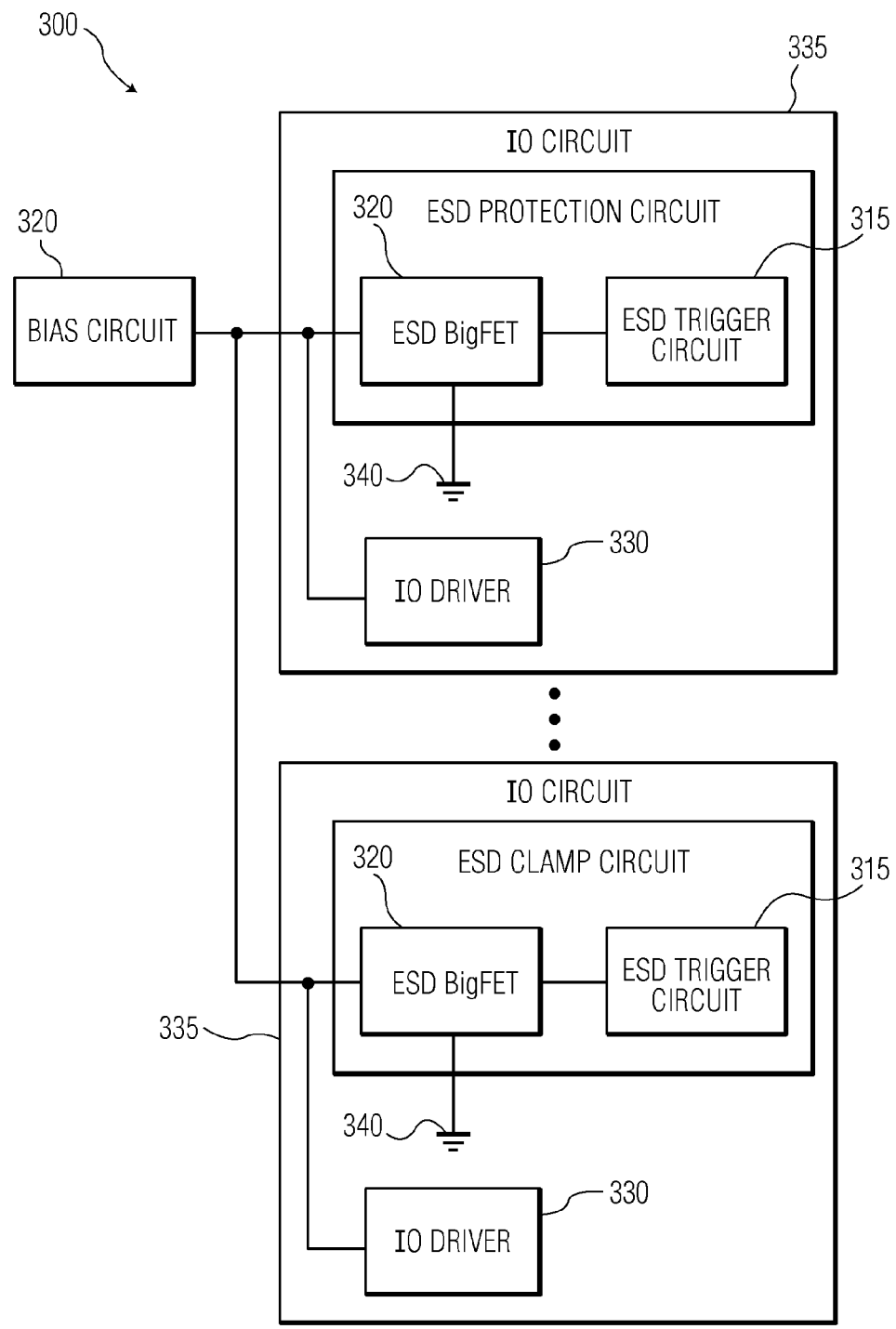
FIG. 3 illustrates an embodiment in accordance with the invention of an integrated circuit with a distributed ESD protection for the IO circuits.

FIG. 3 illustrates an embodiment in accordance with the invention of an integrated circuit with a distributed ESD protection for the IO circuits. The integrated circuit 300 includes a number of IO circuits 335 and a bias circuit 320. The IO circuit 335 includes an ESD protection circuit 305, and an IO driver circuit 330. The ESD protection circuit 305 includes an ESD BigFET 310 and ESD trigger circuit 315. The ESD BigFET 310 may be an NMOS device as described in FIG. 1 or a PMOS device depending in various design parameters. In either case the BigFET is designed to be able to handle a specified level of ESD. The ESD trigger circuit 315 detects ESD in the IC, especially ESD present at the IO of the IC 300. When the trigger circuit 315 detects ESD, the trigger circuit 315 produces a trigger signal to switch and open the ESD BigFET 310 in order to conduct the ESD to ground 340 or to a common rail The bias circuit 320 provides a bias signal to the ESD BigFETs 310 when the IC is in normal operation. The bias signal back biases the ESD BigFETs 310 in order to reduce the static leakage current of the ESD BigFETs 310. As discussed above, the bias signal may have a negative or positive voltage relative to ground depending on whether the BigFET 310 is an NMOS (negative bias) or PMOS (positive bias) device. The bias circuit 320 and ESD protection circuit 305 may include specific isolating and control elements in order to control the application of the bias signal during normal operation of the IC 300 as well as during ESD. An example of a more detailed embodiment in accordance with the invention for these circuits will be described below in FIG. 4.

The IO driver circuits 330 may also include a large semiconductor conductor transistor. Such large semiconductor transistors may also be back biased in order to reduce their static leakage current. Accordingly the bias circuit 320 may also provide a bias signal to the IO driver circuits 330. The IO driver circuit 330 also has an enable pin that receives a control signal to enable and disable the IO driver circuit 330 and hence the IO pin. The control signal applied to the enable pin of the IO driver circuit 330 may also be used to apply the bias signal to the large semiconductor transistor in the IO driver circuit 330 when the IO driver circuit 330 is idle.

The bias circuit 220, 320 may be either internal or external to the IC 200. In situations where the bias circuit cannot easily be implemented internally to the IC, the IC may include an additional IO that receives an external bias signal from an external bias circuit. The use of an external bias circuit does result in an additional IO that needs to have ESD protection as well. Further, the bias rail would need to be thicker because it is subject to ESD due to the external connection. Further, if the external bias circuit generates a negative bias signal, the IO for the bias signal may not be able to use normal MOS transistors due to the negative voltage, thus other types of transistors such as Grounded Gate NMOS Transistor (GGNMOST) or low voltage triggered configurations (LVTSCR) structure using a parasitic bipolar may be needed. Also, a negative voltage would have to be generated externally when the bias signal needs to be applied to a NMOS BigFET. Further, when a bias signal is used there may be a bit of a delay in overcoming the effect of the back bias signal if applied to IO drivers, so the timing of the turning on the IO drives needs to account for such a delay. Also, the external bias circuit may be used with either the centralized or distributed ESD system.

Figure 4:
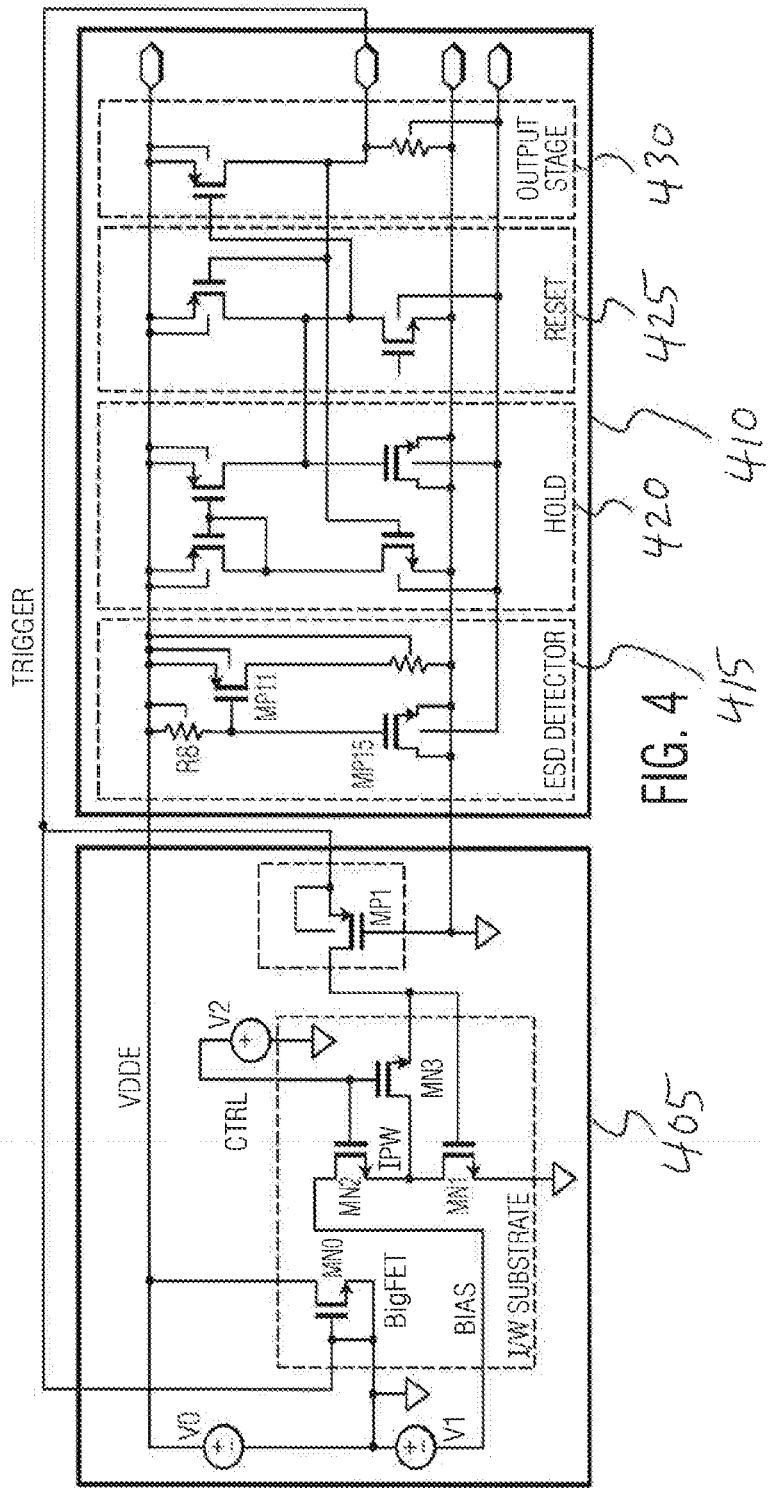
FIG. 4 illustrates an embodiment in accordance with the invention of an ESD protection circuit and an ESD trigger circuit.

FIG. 4 illustrates an embodiment in accordance with the invention of an ESD protection circuit and an ESD trigger circuit. The ESD protection circuit 400 includes a reverse body bias (RBB) circuit 405 and an ESD trigger circuit 410. The ESD trigger circuit further includes a detection circuit 415, a hold circuit 420, a reset circuit 425, and an output stage circuit 430. The detection circuit 415 detects an ESD and produces a signal. The produced signal will be present for a certain time based upon a time constant based upon the resistor R8 and transistor MN15. The hold circuit 420 holds the signal produced by the detection circuit 415. The reset circuit 425 determines when the ESD has finished and resets the trigger circuit 410 to an off state. The output stage circuit 430 includes a drive circuit to output the ESD trigger signal for use by other circuits.

The RBB 405 includes the BigFET transistor MN0. BigFET MN0 when turned on and opened provides a path for the ESD when present. BigFET MN0 includes an IPW substrate that has an IPW node where a bias signal may be applied to the IPW substrate to back bias the BigFET MN0. The source of BigFET MN0 is connected to ground GND, the drain to VDDE, and the gate to the ESD trigger signal TRIG. A voltage source V0 supplies the voltage VDDE to the various circuit elements, which in this example is 3V. A voltage source V1 provides the bias voltage BIAS to back bias the BigFET MN0. In this example, the bias voltage has a value of −1V.

MN1 and MN2 are transistors that control the voltage applied to the node IPW that provides the bias to IPW of BigFET MN0. The drain of MN2 is connected to the voltage source V1 (negative with respect to ground) and receives the BIAS signal. The source of MN2 is connected to the node IPW, and the gate is connected to a voltage source V2 that produces a control signal CTRL. The voltage source may produce a 1.8V signal that drives the gate of MN2 during the normal operation mode. During ESD both V1 and CTRL may not be present The drain of MN1 is connected to the node IPW, and the source is connected to ground GND. The gate of MN1 receives the ESD trigger signal TRIG via a transistor MP1. A further transistor MN3 has a source that receives the ESD trigger signal TRIG via a transistor MP1 and a drain connected to the node IPW and hence the drain of MN1. The gate of MN3 is driven by the control signal CTRL. MN3 causes MN1 to be in a diode configuration and this prevents MN1 from turning on due to the negative voltage at IPW due to the negative bias signal BIAS. The transistor MP1 has a source connected to the trigger signal TRIG, a drain connected to the gate of MN1 and the source of MN3, and a gate connected to ground.

Now the operation of the ESD protection circuit will be described. During ESD operation the ESD trigger circuit 410 will detect the ESD and produce the ESD trigger signal TRIG. The ESD trigger signal TRIG will be applied to gate of BigFET MN0 which will open BigFET MN0 and allow the ESD current to flow through BigFET MN0 to ground or to a common rail. The ESD trigger signal TRIG is also applied to the gate of MN1 via MP1, which connects the node IPW to ground, thus removing the back bias from BigFET MN0 to assure proper operation of the ESD protection circuit.

During normal operation, the control signal CTRL from V2 turns on both MN2 and MN3. With MN2 on the bias signal BIAS is applied to the node IPW and thus back biases BigFET MN0 in order to reduce the static leakage current of BigFET MN0. With MN3 on, MN1 is placed in a diode configuration and MN1 is off because the gate is driven negative with respect to the source and there is no Vgs (gate to source voltage). With MN1 in a diode configuration the negative voltage of the bias signal BIAS will not turn MN1 on, which would ground the node IPW and thus defeat the back biasing of BigFET MN0. Further, with MN3 on, the negative voltage of the bias signal BIAS is applied back towards the ESD trigger circuit, but MP1 isolates the ESD trigger circuit 410 from the bias signal BIAS during normal operation by being off during normal operation. MP1 remains OFF during normal operation as the drain is driven negative with respect to the gate which is grounded, and the source is connected to ground via the trigger circuit.

Various aspects of the circuit shown in FIG. 4 result from the fact that the bias signal BIAS is a negative voltage. Such a negative voltage affects other devices where such negative voltage is applied. Accordingly, various additional circuit element, e.g., MN3 and MP1 may be used to isolate and negate the effects of the negative voltage bias signal BIAS.

The BigFET devices described herein may include isolated wells that may be used to back bias the BigFET devices. If the device is an NMOS device, the isolated well will be an isolated P-well. If the device is a PMOS device, the isolated well will be an isolated N-well.

It should be appreciated by those skilled in the art that any block diagrams herein represent conceptual views of illustrative circuitry embodying the principles of the invention. Further, in the circuits shown additional elements may also be included as needed, or variations to the structure of the circuit may be made to achieve the same functional results as the circuits illustrated.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. An input/output (IO) circuit comprising:
    an IO driver circuit;
    an electrostatic discharge (ESD) protection semiconductor switch with a first input configured to receive an ESD, a second input connected to an ESD rail, and a switch control input;
    an ESD trigger circuit connected to the switch control input, wherein the ESD trigger circuit is configured to produce a trigger signal to close the ESD protection semiconductor switch when an ESD detection circuit detects the ESD;
    a bias circuit configured to provide a back bias signal to an isolated well of the ESD protection semiconductor switch when the IO driver circuit is in normal operation; and
    an output semiconductor switch connected between the ESD trigger circuit and the switch control input, wherein the output semiconductor switch is configured to isolate the ESD trigger circuit from the back bias signal the ESD protection semiconductor switch is an NMOS device and the back bias signal is negative relative to a ground, and the output semiconductor switch is configured to isolate the ESD trigger circuit from the negative back bias signal.

2. The IO circuit of claim 1, wherein the negative back bias signal is applied to an isolated p-well (IPW) of the ESD protection semiconductor switch.

3. The IO circuit of claim 2, wherein the ESD protection circuit, further comprises:
    an input semiconductor switch connected between the IPW and a ground, wherein the input semiconductor switch is configured to prevent connection of the back bias signal to the ground during normal operation.

4. The IO circuit of claim 1, wherein the IO driver circuit further comprises:
    an IO semiconductor driver, wherein the IO semiconductor driver receives the back bias signal when the IO driver circuit is in an idle state.

5. The IO circuit of claim 1, wherein an ESD rail is a ground.

6. The IO circuit of claim 1, wherein the bias circuit is external to the TO driver circuit.

7. The IO circuit of claim 1, further comprising:
    a bias voltage switch connected between the bias circuit and the switch control input, wherein the bias voltage switch is configured to isolate the ESD protection semiconductor switch from the back bias signal.

8. The IO circuit of claim 1, further comprising:
    a grounding switch connected between the isolated well and ground, wherein the grounding switch is configured to prevent connection of the back bias signal to the ground during normal operation of the integrated circuit.

9. An input/output (IO) circuit comprising:
    an IO driver circuit;
    an electrostatic discharge (ESD) protection semiconductor switch with a first input configured to receive an ESD, a second input connected to an ESD rail, and a switch control input;
    an ESD trigger circuit connected to the switch control input, wherein the ESD trigger circuit is configured to produce a trigger signal to close the ESD protection semiconductor switch when an ESD detection circuit detects the ESD;
    a bias circuit configured to provide a back bias signal to an isolated well of the ESD protection semiconductor switch when the IO driver circuit is in normal operation; and
    an output semiconductor switch connected between the ESD trigger circuit and the switch control input, wherein the output semiconductor switch is configured to isolate the ESD trigger circuit from the back bias signal, the ESD protection semiconductor switch and the IO driver circuit are PMOS devices, the back bias is positive relative to a supply connected to a source.

10. The IO circuit of claim 9, wherein the positive back bias signal is applied to an isolated p-well of the IO driver circuit.

11. The IO circuit of claim 10, wherein the ESD protection circuit further comprises:
    an input semiconductor switch connected between the IPW and a ground, wherein the input semiconductor switch is configured to prevent connection of the positive back bias signal to the ground during normal operation.

12. The IO circuit of claim 9, wherein the IO driver circuit further comprises:
    an IO semiconductor driver, wherein the IO semiconductor driver receives the positive back bias signal when the IO driver circuit is in an idle state.

13. The IO circuit of claim 9, wherein an ESD rail is a ground.

14. The IO circuit of claim 9, wherein the bias circuit is external to the IO driver circuit.

15. A method of back biasing an electrostatic discharge (ESD) protection semiconductor switch having an isolated well in an TO circuit comprising:
    applying a back bias signal to the isolated well of the ESD protection semiconductor switch during normal integrated circuit operation;
    detecting an ESD;
    generating an ESD trigger signal;
    applying the ESD trigger signal to the ESD protection semiconductor switch to open the ESD protection semiconductor switch to connect the ESD to an ESD rail;
    grounding the isolated well when the ESD is detected; and
    protecting the ESD trigger signal from the back bias signal with an output semiconductor switch connected between the ESD trigger signal and the ESD protection semiconductor switch wherein the ESD protection semiconductor switch is an NMOS device, the back bias signal is negative relative to a ground, and the output semiconductor switch is configured to isolate the ESD trigger circuit from the negative back bias signal.

16. The method of claim 15, further comprising:
back biasing an TO semiconductor driver when the TO circuit is idle.

17. The method of claim 15, wherein the isolated well is an isolated p-well (IPW) and the back bias signal is applied to the IPW of the ESD protection semiconductor switch.

18. The method of claim 15 further comprising:
preventing connection of the back bias signal to the ground during normal operation.

19. An input/output (IO) circuit comprising:
an IO driver circuit;
an electrostatic discharge (ESD) protection semiconductor switch having an isolated p-well (IPW) node, wherein the ESD protection semiconductor switch is connected between a voltage source and a ground configured to connect the ESD to the ground, wherein the ESD protection semiconductor switch is an NMOS device;
an ESD trigger circuit connected to a gate of the ESD protection semiconductor switch, wherein the ESD trigger circuit is configured to produce a trigger signal to close the ESD protection semiconductor switch when an ESD detection circuit detects an ESD;
a bias voltage source configured to produce a negative back bias signal;
a bias voltage semiconductor switch connected between the bias voltage source and the ESD protection semiconductor switch, wherein the bias voltage semiconductor switch is configured to control application of the back bias signal to the IPW node; and
an IPW node grounding semiconductor switch connected between the IPW node and the ground, wherein the IPW node grounding semiconductor switch is configured to connect the IPW node to the ground based upon the trigger signal indicating the ESD.

20. The IO circuit of claim 19, further comprising:
an IPW node protection semiconductor switch connected between a drain and a gate of the IPW node grounding semiconductor switch, wherein the IPW node protection semiconductor switch is configured to place the IPW node grounding semiconductor switch in a diode configuration.

21. The IO circuit of claim 20, further comprising:
an ESD trigger circuit protection semiconductor switch connected between the ESD trigger circuit and the gate of the IPW node grounding semiconductor switch.

22. The IO circuit of claim 21, further comprising:
a control voltage source connected to gates of the bias voltage semiconductor switch and the IPW node protection semiconductor switch.

* * * * *